(12) United States Patent
Eichelberg (10) Patent No.: US 9,104,387 B1
(45) Date of Patent: Aug. 11, 2015

(54) RACK SLIDE SYSTEM

(75) Inventor: John W. Eichelberg, Spokane, WA (US)

(73) Assignee: Amazon Technologies, Inc., Seattle, WA (US)

( * ) Notice: Subject to any disclaimer, the term of this patent is extended or adjusted under 35 U.S.C. 154(b) by 1117 days.

(21) Appl. No.: 12/979,005

(22) Filed: Dec. 27, 2010

(51) Int. Cl.
*H05K 5/00* (2006.01)
*G06F 1/20* (2006.01)

(52) U.S. Cl.
CPC .......................... *G06F 1/20* (2013.01)

(58) Field of Classification Search
USPC .......................................... 454/184; 361/690
See application file for complete search history.

(56) References Cited

U.S. PATENT DOCUMENTS

| | | | | |
|---|---|---|---|---|
| 2,145,797 A | * | 1/1939 | Merkel | 361/608 |
| 4,197,434 A | * | 4/1980 | Inamasu et al. | 379/327 |
| 4,307,922 A | * | 12/1981 | Rhodes, Jr. | 312/198 |
| 4,693,418 A | * | 9/1987 | Peterman | 238/10 R |
| 7,646,590 B1 | * | 1/2010 | Corhodzic et al. | 361/641 |
| 2006/0158866 A1 | * | 7/2006 | Peterson et al. | 361/796 |
| 2006/0276121 A1 | * | 12/2006 | Rasmussen | 454/184 |
| 2007/0167125 A1 | * | 7/2007 | Rasmussen et al. | 454/184 |
| 2010/0048119 A1 | * | 2/2010 | Tashiro | 454/184 |
| 2011/0157829 A1 | * | 6/2011 | Wormsbecher et al. | 361/701 |

* cited by examiner

*Primary Examiner* — Alissa Tompkins
*Assistant Examiner* — Brittany Towns
(74) *Attorney, Agent, or Firm* — Thomas | Horstemeyer, LLP (57) ABSTRACT

Embodiments of the present disclosure provide a rack slide system comprising an elongated supporting structure and a plurality of mobile racks mounted on the elongated supporting structure in side-by-side relation for movement along a controlled path, where the length of the path exceeds by a predetermined amount the sum of the depths of the mobile racks to provide at least one gap between selected ones of the mobile racks.

11 Claims, 5 Drawing Sheets

RACK SLIDE SYSTEM

BACKGROUND

Data centers have been experiencing problems with heat for several years. In data centers and computer rooms, computer hardware is installed in computer racks and cabinets. Generally, computer racks are lined up in alternating rows with cold-air intakes all facing one aisle (a cold aisle) and hot-air exhausts all facing another aisle (a hot aisle). One potential problem is hardware that features side-to-side ventilation having a right-to-left airflow pattern does not match up with the layout of the cold and hot aisles, since the layout is designed for a front-to-back airflow pattern or ventilation.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

With computer servers and other computer hardware, front-to-back cooling airflow has generally been the standard. However, a majority of network vendors that provide solutions for the growing demand of port density are now using side-to-side cooling airflow as a standard. This side-to-side cooling method has never really been adopted in the data centers and network rooms, since it breaks away from the standard/traditional front-to-back cooling that is utilized with most server vendors, where ambient air is drawn in for cooling from the front and heated exhaust air is discharged to the rear.

However, some vendors have adopted side-to-side cooling airflow in their computer products. For example, Cisco has been using side-to-side cooling with the introduction of the 5K series switch and later in the 4K, 5K, 6K, and 7K series routers and switches.

Figure 1:
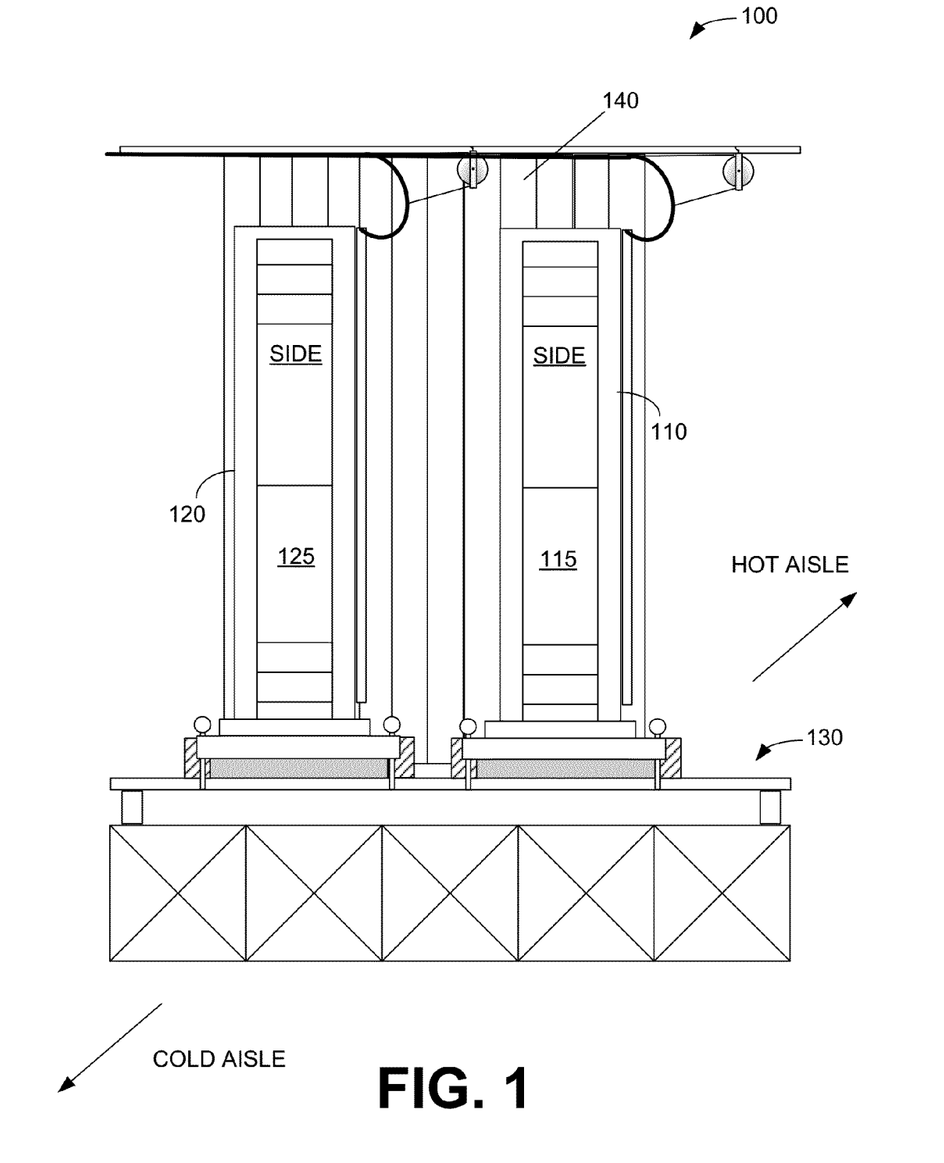
FIG. 1 is a diagram depicting a front view of one embodiment of a network room rack slide system in accordance with the present disclosure.

Regarding these concerns, FIG. 1 is a diagram depicting a front view of one embodiment of a network room rack slide system 100 in accordance with the present disclosure. Here, the network racks 110, 120 within a network room or data center are turned 90 degrees and placed on an elongated supporting structure 130 (e.g., slide rail system, guide rails, rail tracks, etc.). The network racks 110, 120 contain network gear or equipment 115, 125 that uses side-to-side cooling. The network racks 110, 120 (e.g., 54 RMU racks) are then secured to the elongated supporting structure 130 which contains dampening control to avoid abrupt movements and remove the possibility of hardware damage. In one embodiment, an aisle containment curtain 140 may be hung on a pole or track, or the like, above the network racks and moved to the left or right, as needed, when relative positions of network racks 110, 120 changes. The aisle containment curtain 140 fits in between the gap of two neighboring racks 110, 120 and is adjustable to accommodate a gap of any size. In one embodiment, the aisle containment curtain 140 is made of fire resistant plastic or vinyl. The curtain 140 is part of a hot aisle containment system.

With regard to the term "rack mounting units" or "RMU," it is well known that the vertical dimension of equipment enclosures is frequently measured in standardized units. The most common unit of measurement is the "rack mounting unit" ("RMU"). According to accepted standards, an RMU is defined as 1.75 inches in height. Electrical components as well as accessories, which include horizontal raceways, patch panels, and the like, are also commonly measured in RMUs. For example, a 2 RMU component is one which is 3.50 inches or less in height. Thus, a rack which has 54 RMUs may accommodate components and accessories totaling 54 RMUs. Further, to conserve space, components and accessories are frequently installed only at vertical locations corresponding to a whole number of RMUs in order to avoid interfering with adjacent components and accessories.

Embodiments of the network room rack slide system 100 create true hot and cold aisles in a network room featuring side-to-side cooling equipment 115, 125. Generally, cooling comes from floor in front of the racks 110, 120, such as through a raised floor (e.g., having perforated tiles) in front of the rack 110, 120. Cool air is drawn through the equipment 115, 125 and exhausted out to the next aisle behind it, which is the hot aisle. In accordance with an embodiment of the present disclosure, for equipment having side-to-side ventilation, racks 110, 120 are turned 90 degrees so that the side of the equipment 115, 125 that has intake vents or inlets faces a cold aisle in a network room and the side of the equipment that has exhaust vents faces a hot aisle in the network room. This is more efficient for the facility. Another key factor with the network room slack slide system 100 is the efficient utilization of space within the network room. By placing network racks 110, 120 on an elongated supporting structure, such as slide rails or guide rails, the network racks 110, 120 can be moved in close proximity of one another and moved around, when necessary, to create workspace for maintaining or configuring a particular network rack 110, 120 and its mounted equipment 115, 125. In one embodiment, no one rack can move any distance greater than an entire rack length. This provides enough room for data center operations (DCO) personnel to add/remove network cards and manage cabling for new installs.

Accordingly, one rack space is maintained on the network room rack slide system 100 to provide working space between a particular rack 110 and a neighboring rack 120 for any one of the racks by moving racks up and down the network room slide system 100. When the racks 110, 120 are moved in close proximity to one another on the elongated supporting system 130, the network rack space ("work space") exists at the end of the support (e.g., slide rail) opposite to the end containing the first rack in the line of network racks.

Figure 2:
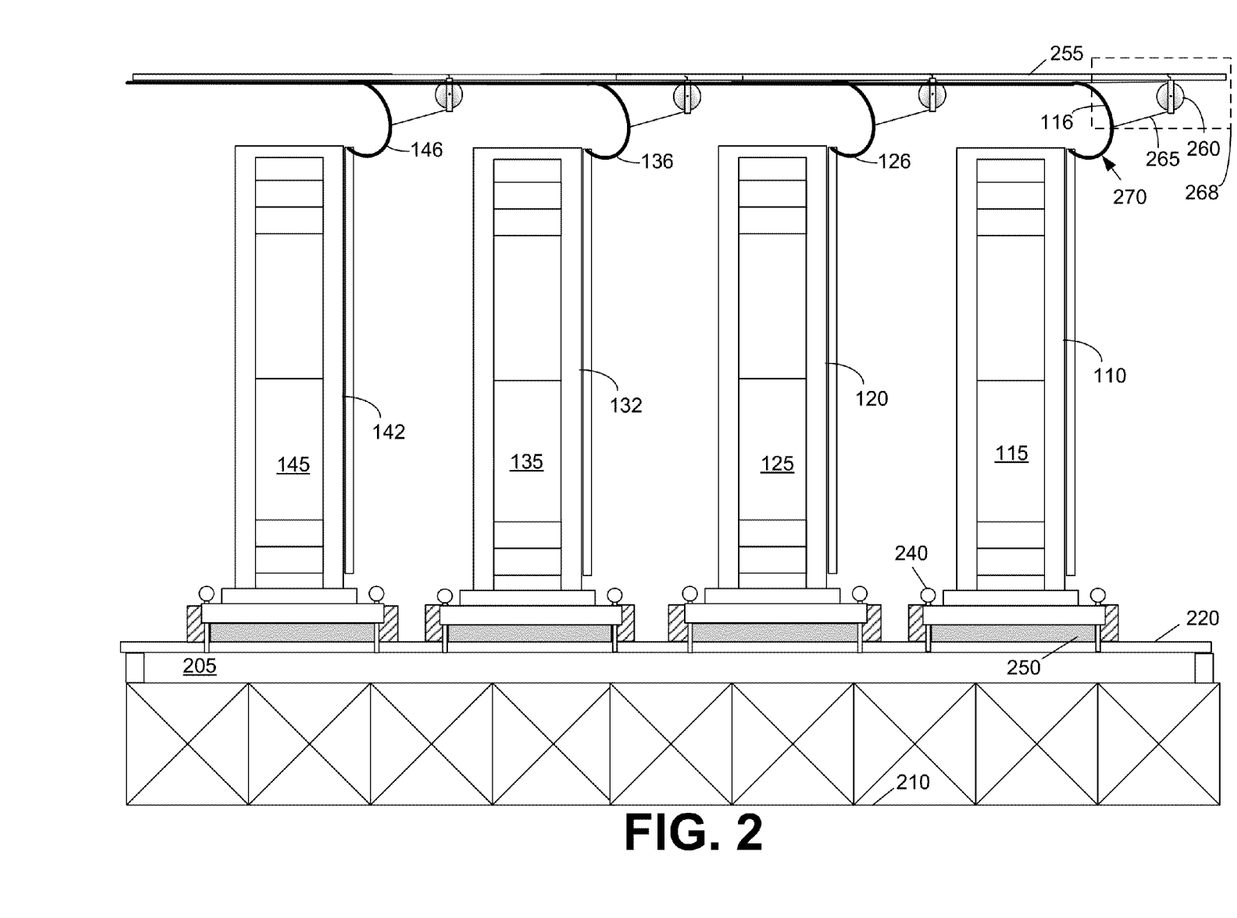
FIG. 2 is a diagram depicting an embodiment of the network rack rail system of FIG. 1 having additional network racks according to an embodiment of the present disclosure.

To illustrate, FIG. 2 is a diagram depicting an embodiment of the network rack slide rail system with additional racks shown on the elongated supporting system 130. In FIG. 2, mobile network racks 110, 120, 132, 142 house electronic equipment 115, 125, 135, 145 respectively. The aisle containment curtain 140 (FIG. 1) is not shown in FIG. 2, although it may be employed with the system, in some embodiments.

In this illustration, there are four network racks turned so that the sides of the racks are oriented towards the viewer of the figure. Note, in one general implementation of a network room or data center floor, the room contains a raised floor which can be from 2 to 5 feet high. The raised floor provides the plenum for pumping cold air into a cold aisle in front of the network racks.

To accommodate the network rack rail system 100 (FIG. 1) in this type of environment, one implementation, in accordance with the present disclosure, installs a large metal box frame 210 in the subfloor with slide rails 220 built on top of this structure. The box frame supports the weight of the structures and equipment above it. Slide plates 250 (made of metal or other sturdy structure) are mounted to the rail 220 and fixed to the racks 110, 120, 132, 142. The slide rail tracks 220 and the slide plates 250 mate with each other to form a slide rail that works together to move the network rack(s). For example, in one embodiment, the slide rail system includes an inside slide plate 250 and an outside slide rail track 220 such that the network rack is able to move through cooperation of the outside slide rail track 220 and the inside slide plate 250.

In one embodiment, spring-loaded pins 240 are used to lock the rack in place within its position on the slide rail tracks 220. For example, predrilled holes may be contained in the rails for inserting the spring-loaded pins 240. The slide rails themselves have balls, rollers, or bearings that mount and clamp on top and bottom of the slide rail tracks 220. The slide plates 250 mount to those bearings, etc.

Embodiments of the present disclosure will be described as being applied to, but not limited to, manually movable wheeled network racks. Referring to FIG. 2, four movable network racks 110, 120, 132, 142 each consisting of a top frame, a bottom frame, and opposed side frames are movable along slide rails 130, 220 on the subfloor 205 in a network room or the like. Each of the movable network racks 110, 120, 132, 142 is movable in either direction when an operator asserts a force against the rack. A variety of slide rail systems may be utilized in accordance with the present disclosure, and embodiments of the present disclosure are not limited to those described and shown with respect to the figures, as understood by one of ordinary skill in the art.

In one arrangement of a network room in accordance with the network rack slide system 100, cable trays 255 extend over the network racks 110, 120, 132, 142 along a length of the slide rails 220. Network cables 116, 126, 136, 146 run down cable trays 255 to the network racks 110, 120, 132, 142. In a network room or data center without a network rack slide system, the network cables would be installed to drop from the cable tray and connect to vertical cable managers attached to the network racks.

With the network rack slide system 100, since the network racks 110, 120, 132, 142 are moving along a length of the slide rail tracks 220, a cable management pulley system 268 is deployed to allow for movement of the network cable 116, 126, 136, 146 connected to the moving network rack 110, 120, 132, 142. A ladder rack system may be used and employed overhead of the slide rail tracks 220 in addition or in concert with the cable trays 255 to provide support for the cable management pulley system 268.

In one embodiment of the cable management pulley system 268, a draw string or cord 265 is attached to the network cable 116, 126, 136, 146 and wrapped around a tension pulley 260 that is part of the cable management pulley system 268. The tension pulley 260 is spring loaded to retrieve a certain amount of slack in the network cable 116, 126, 136, 146 when tension is not being applied to the network cable 116, 126, 136, 146 attributed to the network cable being moved away from the cable management pulley system 268. When the network rack 110, 120, 132, 142 is positioned close to the cable management pulley system 268, a slack loop 270 is allowed to form by the cable management pulley system 268 without allowing the network cable 116, 126, 136, 146 to droop or extend down on the network rack 110, 120, 132, 142. When the network rack 110, 120, 132, 142 is moved on the slide rail, the pulley 260 allows the network cable 116, 126, 136, 146 to move one way or another while preventing excess slack in the network cable line 116, 126, 136, 146. The cable management pulley system 268 provides flexibility in fiber and copper slack for movement of the network rack slide system 100.

Figure 3:
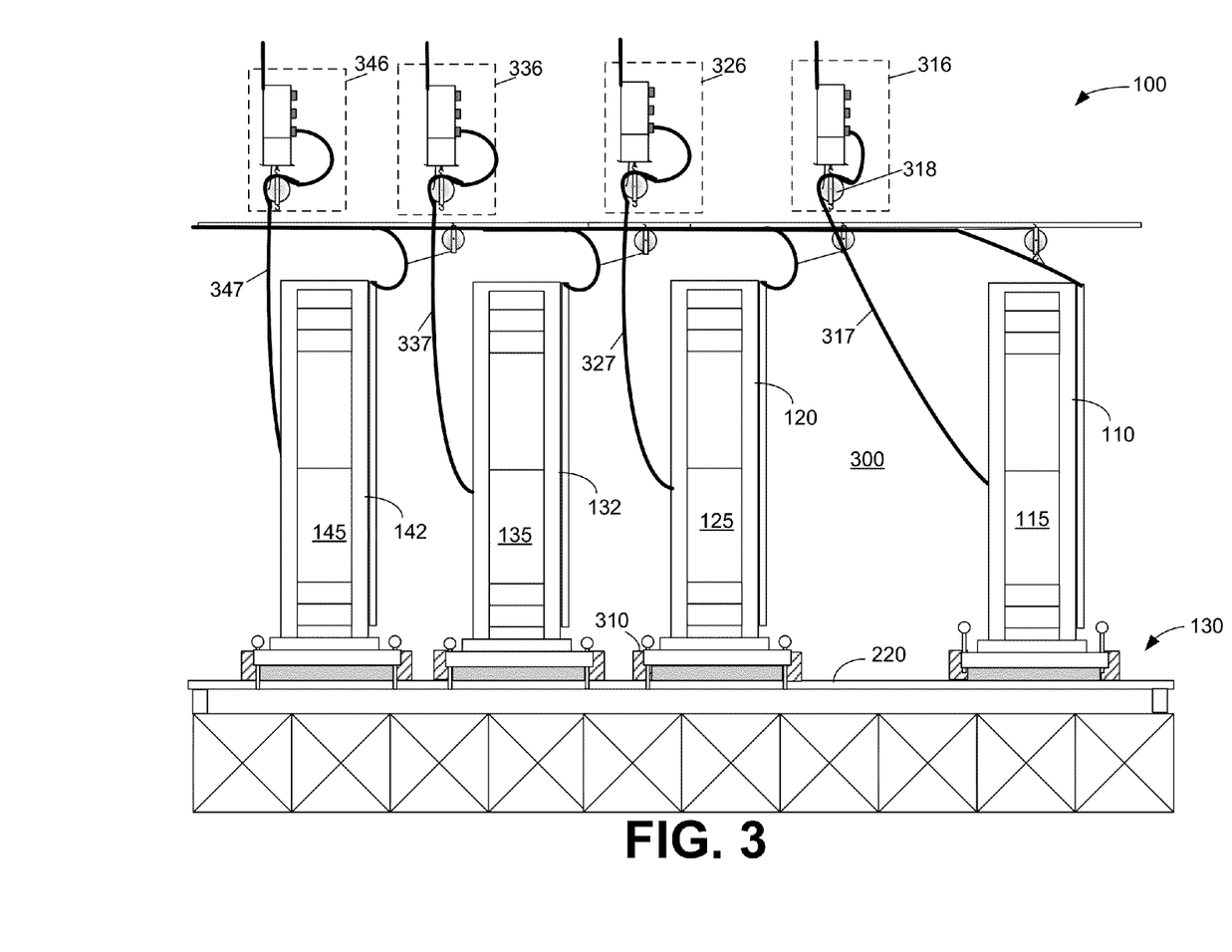
FIG. 3 is a diagram depicting an embodiment of the network rack rail system of FIG. 1 having additional network racks, where a workspace is created according to an embodiment of the present disclosure.

As shown in FIG. 3, separate from the cable management pulley system 268, an overhead power distribution system 316, 326, 336, 346 may also be used to route power cables and cords 317, 327, 337, 347 to the equipment 115, 125, 135, 145 housed in the network racks 110, 120, 132, 142. In one embodiment, the overhead power distribution system 316, 326, 336, 346 may include a retractable power cord management pulley that provides tension to a power cord 317, 327, 337, 347 and creates manageable slack in the power cable 317, 327, 337, 347 enabling the network rack 110, 120, 132, 142 to move any direction on the slide rails (similar in concept to the cable management pulley system 268). The power cord management pulley 318 is shown extending from the overhead power distribution system 316, which may be secured to a frame extending a length of the slide rail tracks 220. A power cable 317, 327, 337, 347 plugs into the power distribution system 316, 326, 336, 346. The power cable 317, 327, 337, 347 is from the equipment 115, 125, 135, 145 housed in the network rack 110, 120, 132, 142. In accordance with the present disclosure, if a particular network rack 110 at the far right of the network rack slide system 100 shown in FIG. 3 needs to be worked upon in some manner, the particular network rack 110 may be moved over in an implementation where extra space exists at the end next to the network rack 110. Otherwise, in a different implementation where extra space exists at the opposite end, the other network racks 120, 132, 142 may be moved over, and the particular network rack 110 may stay at its current position. Therefore, a workspace 300 is created next to the particular network rack 110. In this way, workspace can be created in between any one of the racks that is on the slide rails track 220.

It is noted that a bumper 310 is provided at the end of each rack 110, 120, 132, 142 to allow for a certain amount of space at the end of each rack 110, 120, 132, 142 and to provide a cushion against an impact (e.g., hitting a neighboring rack). The bumper 310 also provides for space that allows network cables to come from the front of equipment mounted in a network rack and be routed to avoid possible entanglements. In one embodiment, the bumper 310 is composed of a hard rubber that provides a resilient surface to impact forces. To avoid equipment 115, 125 within racks sandwiching against one another on the slide rails and possibly damaging network cables, the bumpers 310 assure a minimum amount of space for the cables and provide protection against impact with other racks or other equipment. In some embodiments, a vertical cable management rack is provided on the network racks themselves to control and manage routing of network racks to the housed equipment. Accordingly, the bumper 310 helps provide space to be routed to the vertical cable management rack.

Figure 4:
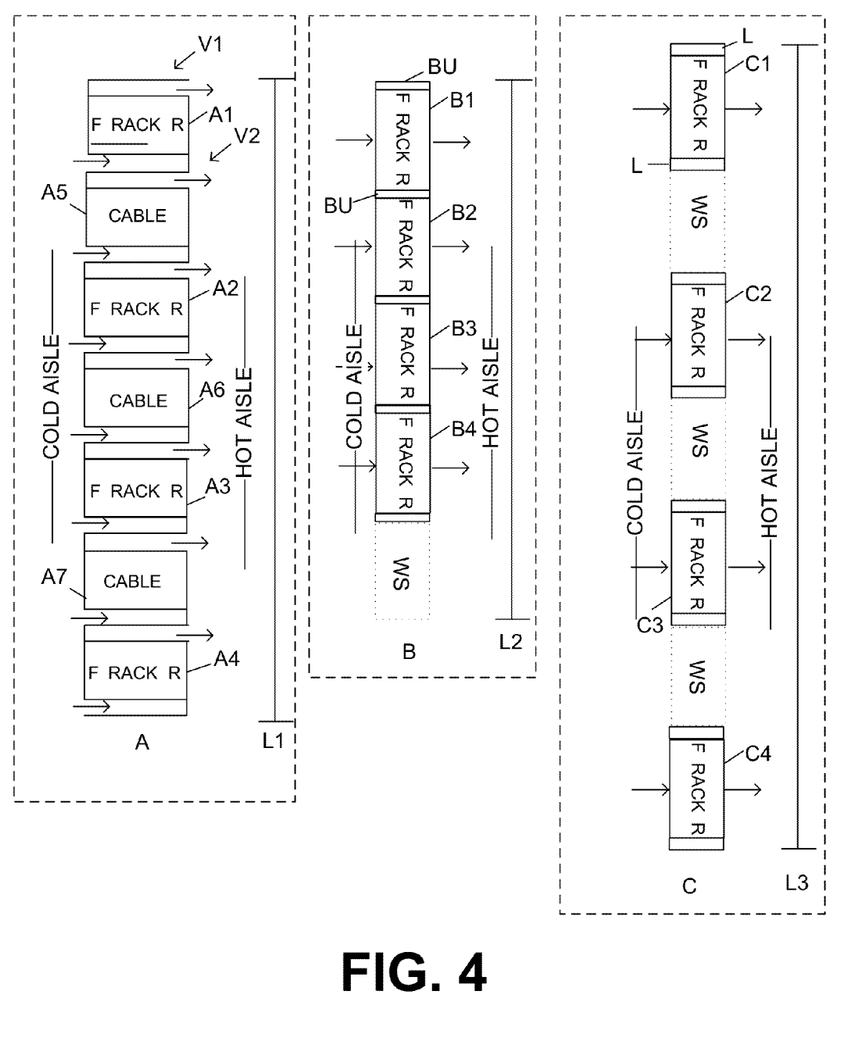
FIG. 4 is a diagram of comparison models of various network room layouts for racks housing equipment with side-to-side ventilation including the system of FIG. 1 according to an embodiment of the present disclosure.

Referring now to FIG. 4, comparison models of various network room layouts for racks housing equipment with side-to-side ventilation are shown. On the left of the figure (Arrangement A), four network racks A1, A2, A3, A4 housing equipment with side-to-side ventilation are shown, where a front of the equipment is facing a cold aisle and the rear of the equipment is facing a hot aisle. Since the right side of the equipment is the intake side and the left side is the exhaust side, the equipment is not going to be intaking air from the cold air aisle and exhausting air to the hot aisle without supplemental assistance. Accordingly, ventilation channels V1, V2 are provided next to the racks A1, A2, A3, A4 to direct intake air from the cold aisle to the intake vents of the equipment and to direct exhaust air from the exhaust vents of the equipment to the hot aisle within the network room. Let's assume that the network racks A1, A2, A3, A4 are 54 RMU racks and that an individual piece of equipment being housed in the rack is 25 RMU high and has a 20.3"×29" footprint. Then, the racks A1, A2, A3, A4 can house 2 pieces of equipment but not much room for anything else. Therefore, separate racks A5, A6, A7 are used to house network cable patch panels to terminate fiber/copper for the housed equipment. For a standard width of 20.3 inches for the network racks A1, A2, A3, A4 and a width of 12 inches together (or 6 inches individually) for the two channels V2 between neighboring racks A1, A2, a total length (L1) of this arrangement exceeds 226 inches.

Next, consider the arrangement (Arrangement C) at the right of the figure. In this arrangement, 4 racks C1, C2, C3, C4 are turned 90 degrees so that the intake vents on the side of the equipment (utilizing side-to-side cooling) face a cold aisle and the exhaust vents face a hot aisle. Assume the racks C1, C2, C3, C4 are mounted with L-brackets (L) to the floor and a 34 inch workspace (WS) is preserved next to each rack C1, C2, C3, C4. For this arrangement, the total length (L3) of a row of racks is approximately 266 feet (taking into account that the dimensions of the L-brackets will extend the footprint of the network racks). For example, the footprint of a network rack C1, C2, C3, C4 may extend from 34 inches to 41 inches after being secured with L-brackets (L) to the underlying floor.

Now, consider the arrangement (Arrangement B) at the center of the figure which utilizes an embodiment of the network rack slide system 100 (FIG. 1) in accordance with the present disclosure. In this arrangement, 4 racks B1, B2, B3, B4 are turned 90 degrees so that the intake vents on the side of the equipment (utilizing side-to-side cooling) face a cold aisle and the exhaust vents face a hot aisle. By turning the rack 90 degrees, a need for external ventilation channels as used in the arrangement A on the left side of the figure is eliminated. The internal intake fans of the housed equipment are now on the cold side and will exhaust out to the hot aisle. With the racks B1, B2, B3, B4 turned sideways, a aisle containment curtain 140 (FIG. 1) may be used to segregate the hot and cold aisles to facilitate hot aisle containment. In one embodiment, the curtain would go over the top and on the sides of the hot aisle.

Let's assume the footprint of the network rack is 20.3"×34" which includes 3" bumpers (BU) on one side. It is noted by putting the network racks B1, B2, B3, B4 on a network rack slide rail system 100, the racks B1, B2, B3, B4 may be condensed together (save for a bumper BU) and at the end of the row, a gap of 34 inches (which is the depth of the network rack) is preserved. Therefore, instead of 34 inches between each rack B1, B2, B3, B4 (as shown in arrangement C on the right), a single space with 34 inches is formed on the network rack slide system 100 which allows racks B1, B2, B3, B4 to move up or down the slide rail tracks 130 to create a workspace (WS of 34 inches) in between. For this arrangement, the total length (L2) of a row of racks and the single work space exceeds 204 feet.

From these comparisons, the center arrangement is significantly less than the arrangement on the right and the arrangement on the left. Further, in one embodiment, given the network racks are turned 90 degrees, one has the option to side-mount fiber distribution boxes with out taking up additional "true rack row" space.

Figure 5:
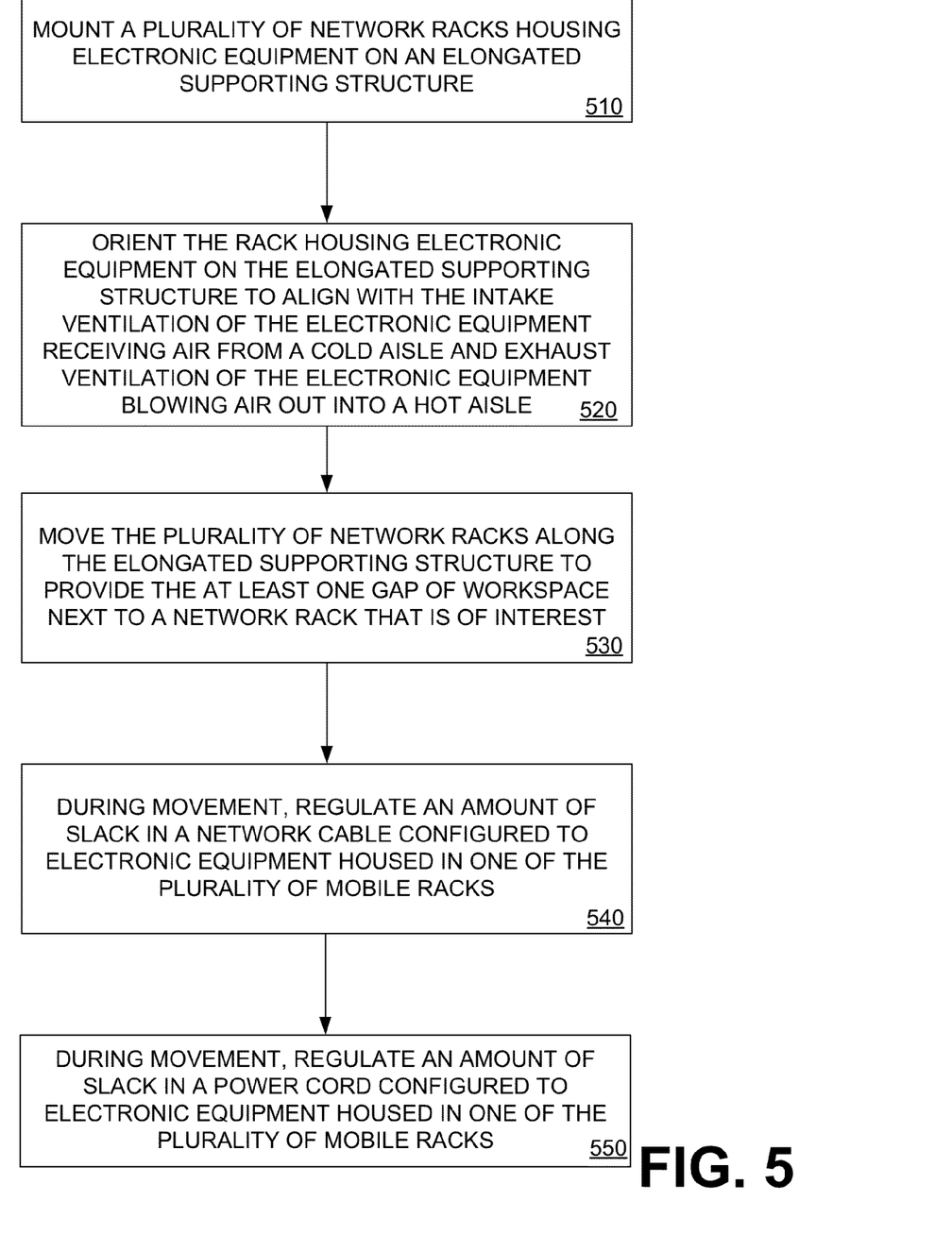
FIG. 5 is a flow chart diagram describing an embodiment of a method of adjusting workspace within a row of mobile network racks in accordance with FIG. 4 according to an embodiment of the present disclosure.

Referring now to FIG. 5, a flow chart diagram describing an embodiment of a method of adjusting workspace within a row of mobile network racks is depicted. The method includes mounting (510) a plurality of network racks 110, 120, 132, 142 (FIGS. 1-3) housing electronic equipment on an elongated supporting structure 130 (FIG. 1). The plurality of mobile racks 110, 120, 132, 142 are mounted on the elongated supporting structure 130 in side-by-side relation for movement along a controlled path, where the length of the path exceeds by a predetermined amount the sum of the depths of the mobile racks 110, 120, 132, 142 to provide at least one gap between selected ones of the mobile racks 110, 120, 132, 142. Accordingly, the plurality of mobile racks 110, 120, 132, 142 are oriented (520) on the elongated supporting structure 130 to align with the intake ventilation of the electronic equipment 115, 125, 135, 145 (FIG. 3) receiving air from a cold aisle and exhaust ventilation of the electronic equipment 115, 125, 135, 145 blowing air out into a hot aisle of a network room.

The method further includes moving (530) the plurality of network racks 115, 125, 135, 145 along the elongated supporting structure 130 to provide at least one gap of workspace next to a network rack 110 of interest (e.g., the network rack may need servicing). In one embodiment, a footprint of at least one gap is equivalent to a footprint of a mobile network rack. Further, an amount of slack in a network cable 116 (FIG. 2) configured to electronic equipment 115 housed in one of the plurality of mobile racks 110 is regulated (540), while a rack housing the electronic equipment is being moved. The length of network cable 116 provided to the network rack 110 may allow the network rack 110 to move any distance that does not exceed an entire rack depth-length along the elongated supporting structure 130. Similarly, an amount of slack in a power cord 317 (FIG. 3) configured to electronic equipment 115 (FIG. 3) housed in one of the plurality of mobile racks 110 is regulated (550), while the rack housing the electronic equipment is being moved.

It should be emphasized that the above-described embodiments of the present disclosure are merely possible examples of implementations, merely set forth for a clear understanding of the principles of the present disclosure. Thus, for example, any sequence(s) and/or temporal order of steps of various processes or methods that are described herein are illustrative and not restrictive. Accordingly, it should be understood that, although steps of various processes or methods may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present disclosure.

One should also note that conditional language, such as, among others, "can," "could," "might," or "may," unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more particular embodiments or that one or more particular embodiments necessarily include logic for deciding, with or without user input or prompting, whether these features, elements and/or steps are included or are to be performed in any particular embodiment.

Accordingly, it is intended that the scope of patent protection afforded the present disclosure is to be defined by the appended claims rather than the description set forth herein. Many variations and modifications may be made to the above-described embodiment(s) without departing substantially from the spirit and principles of the present disclosure. All such modifications and variations are intended to be included herein within the scope of this disclosure and protected by the following claims.

Therefore, having thus described embodiments of the present disclosure, at least the following is claimed:

1. A rack slide system comprising:
   an elongated supporting structure comprising a plurality of slide rails;
   a plurality of mobile racks mounted on the elongated supporting structure in a front-to-back relation for movement along a controlled path, a length of the path exceeding, by a predetermined amount, a sum of depths of the plurality of mobile racks to provide at least one gap between selected ones of the plurality of mobile racks,
   wherein the plurality of mobile racks is arranged to house electronic equipment having side-to-side airflow ventilation, wherein an individual respective one of the plurality of mobile racks has a front, a back, and two sides with side-to-side airflow ventilation and is oriented on the elongated supporting structure to enable an intake ventilation of the electronic equipment to receive air from a cold aisle and an exhaust ventilation of the electronic equipment to blow air out into a hot aisle; and
   an overhead cable management system with tension control to regulate an amount of slack in a network cable connected to the electronic equipment housed in one of the plurality of mobile racks, wherein the overhead cable management system provides to the one of the plurality of mobile racks a length of network cable that allows the one of the plurality of mobile racks to move any distance that does not exceed an entire mobile rack depth-length along the elongated supporting structure,
   wherein the overhead cable management system with tension control comprises a tension pulley that is spring loaded to regulate the slack in the network cable when tension is not being applied to the network cable by the one of the plurality of mobile racks,
   wherein a footprint of the at least one gap is equivalent to or greater than a footprint of the one of the plurality of mobile racks.

2. The rack slide system of claim 1, further comprising:
   an aisle containment curtain that extends between adjacent ones of the plurality of mobile racks and segregates the hot and cold aisles to facilitate hot aisle containment; and
   an overhead power cord management system with tension control to regulate an amount of slack in a power cord connected to the electronic equipment housed in the one of the plurality of mobile racks.

3. A rack slide system comprising:
   an elongated supporting structure;
   a plurality of mobile racks mounted on the elongated supporting structure in a front-to-back relation for movement along a controlled path, a length of the path exceeding, by a predetermined amount, a sum of depths of the plurality of mobile racks to provide at least one gap between selected ones of the plurality of mobile racks; and
   an overhead cable management system with tension control to regulate an amount of slack in a network cable connected to electronic equipment housed in one of the plurality of mobile racks, wherein the overhead cable management system with tension control comprises a tension pulley that is spring loaded to regulate the slack in the network cable when tension is not being applied to the network cable by the one of the plurality of mobile racks,
   wherein a footprint of the at least one gap is equivalent to or greater than a mobile rack footprint,
   wherein the plurality of mobile racks is arranged to house electronic equipment having side-to-side airflow ventilation, wherein an individual respective one of the plurality of mobile racks has a front, a back, and two sides with side-to-side airflow ventilation and is oriented on the elongated supporting structure to enable an intake ventilation of the electronic equipment to receive air from a cold aisle and an exhaust ventilation of the electronic equipment to blow air out into a hot aisle.

4. The rack slide system of claim 3, wherein the elongated supporting structure comprises a plurality of slide rails.

5. The rack slide system of claim 4, wherein the plurality of mobile racks are secured to a plurality of slide plates having rollers for transport along the plurality of slide rails.

6. The rack slide system of claim 3, further comprising a support structure in a subfloor that supports the elongated supporting structure.

7. The rack slide system of claim 3, wherein the overhead cable management system provides to the one of the plurality of mobile racks a length of network cable that allows the one of the plurality of mobile racks to move any distance that does not exceed an entire rack depth-length along the elongated supporting structure.

8. The rack slide system of claim 3, further comprising an aisle containment curtain that extends between adjacent ones of the plurality of mobile racks and segregates the hot and cold aisles to facilitate hot aisle containment.

9. The rack slide system of claim 3, further comprising an overhead power cord management system with tension control to regulate an amount of slack in a power cord connected to electronic equipment housed in one of the plurality of mobile racks.

10. A data center comprising:
    at least a first row of a first plurality of mobile racks;
    a hot aisle defined by a space behind the first row of the first plurality of mobile racks, wherein exhaust from electronic equipment housed in the first plurality of mobile racks in the first row flows to the hot aisle;
    a cold aisle defined by a space in front of the first row of the first plurality of mobile racks, wherein the electronic equipment housed in the first plurality of mobile racks in the first row receives air from the cold aisle; and
    an overhead cable management system with tension control to regulate an amount of slack in a network cable connected to the electronic equipment housed in one of the first plurality of mobile racks, the overhead cable management system being positioned above the first row of the first plurality of mobile racks, wherein the overhead cable management system with tension control comprises a tension pulley that is spring loaded to regulate the slack in the network cable when tension is not being applied to the network cable by the one of the plurality of mobile racks, wherein the first plurality of mobile racks in the first row is mounted on an elongated supporting structure in a front-to-back relation for movement along a controlled path, a length of the path exceeding, by a predetermined amount, a sum of depths of the first plurality of mobile racks to provide at least one gap between selected ones of the first plurality of mobile racks, wherein a footprint of the at least one gap is equivalent to or greater than a mobile rack footprint, and wherein the first plurality of mobile racks is arranged to house electronic equipment having side-to-side airflow ventilation, wherein an individual respective one of the first plurality of mobile racks has a front, a back, and two sides with side-to-side airflow ventilation and is oriented on the elongated supporting structure to enable an intake ventilation of the electronic equipment to receive air from the cold aisle and an exhaust ventilation of the electronic equipment to blow air out into the hot aisle.

11. The data center of claim 10, further comprising a second row of a second plurality of mobile racks, wherein the second plurality of mobile racks in the second row houses electronic equipment having front-to-back airflow ventilation, wherein the hot aisle is disposed between the first row of the first plurality of mobile racks and the second row of the second plurality of mobile racks and a back of the electronic equipment housed in the second row of the second plurality of mobile racks faces the hot aisle.

* * * * *